(12) United States Patent
Shirai

(10) Patent No.: US 6,186,722 B1
(45) Date of Patent: Feb. 13, 2001

(54) CHAMBER APPARATUS FOR PROCESSING SEMICONDUCTOR DEVICES

(75) Inventor: Hidenobu Shirai, Kasugai (JP)

(73) Assignee: Fujitsu Limited, Kawasaki (JP)

( * ) Notice: Under 35 U.S.C. 154(b), the term of this patent shall be extended for 0 days.

(21) Appl. No.: 09/028,460

(22) Filed: Feb. 24, 1998

(30) Foreign Application Priority Data

Feb. 26, 1997 (JP) .................................................. 9-041900

(51) Int. Cl.[7] .................................................. B65G 1/10
(52) U.S. Cl. .......................... 414/217; 414/939; 414/935; 118/719
(58) Field of Search .................... 118/719; 414/217, 414/416, 160, 935, 222, 217.1; 432/239, 242; 204/298.25

(56) References Cited

U.S. PATENT DOCUMENTS

| 5,909,994 | * | 6/1999 | Blum et al. ........................ | 414/939 X |
| 5,934,856 | * | 8/1999 | Asakawa et al. ................. | 414/939 X |

FOREIGN PATENT DOCUMENTS

| 62-252128 | * 11/1987 | (JP) | ..................................... 414/939 |
| 3-14253 | 1/1991 | (JP) | . |
| 3-57150 | 3/1991 | (JP) | . |
| 6-53304 | 2/1994 | (JP) | . |
| 07029963 | 1/1995 | (JP) | . |

* cited by examiner

Primary Examiner—Frank E. Werner
(74) Attorney, Agent, or Firm—Armstrong, Westerman, Hattori, McLeland & Naughton

(57) ABSTRACT

An apparatus suitable for producing semiconductors. The apparatus includes a processing chamber, a first preparatory chamber, and a second preparatory chamber. Workpieces are transferred to the processing chamber for processing in a vacuum. The first and second preparatory chambers are used for transferring the workpiece between the processing chamber and an exterior exposed to atmospheric pressure without exposing the processing chamber to the atmospheric pressure. The first and second preparatory chambers are aligned vertically, which reduces the floor space occupied by the apparatus.

18 Claims, 8 Drawing Sheets

CHAMBER APPARATUS FOR PROCESSING SEMICONDUCTOR DEVICES

BACKGROUND OF THE INVENTION

The present invention relates to appratuses that are suitable for processing semiconductor devices. More particularly, the present invention relates to an apparatus having a semiconductor processing chamber, which is used to process workpieces, and a preparatory chamber, which is used for transferring workpieces without drawing atmospheric air into the processing chamber.

There is a type of semiconductor producing apparatus provided with a processing chamber for processing workpieces in a vacuum environment. Workpieces must be transferred in the vacuum environment. There is a need to shorten the time required for transferring workpieces in both vacuum and atmospheric environments. There is also a need to reduce space occupied by the apparatus. The transferring time is the time from when the transferring of one workpiece is started to when the transferring of the next workpiece is started.

FIG. 1 is a schematic plan view showing a prior art semiconductor producing apparatus 61. The apparatus 61 is provided with a processing chamber 62, a vacuum chamber 63, and two preparatory chambers 64, 65. The processing chamber 62 is under vacuum and is used to process wafers W in a vacuum environment. The vacuum chamber 63, which is also under a vacuum, accommodates a first robot 66 to transfer the wafers W.

Each preparatory chamber 64, 65 has a port. A carrier 67 is arranged in correspondence with the port of the preparatory chamber 64, while a carrier 68 is arranged in correspondence with the port of the preparatory chamber 65. A second robot 69 is arranged between the preparatory chambers 64, 65 and the carriers 67, 68. The second robot 69 transfers unprocessed and processed wafers W between the carriers 67, 68 and the associated preparatory chambers 64, 65 in an atmospheric environment.

The first robot 66 has two hands 66a, 66b. The hands 66a, 66b exchange unprocessed wafers W with processed wafers W. More specifically, one of the hands 66a (66b) exchanges unprocessed wafers W with processed wafers W in one of the preparatory chambers 64, 65. The other hand 66a (66b) exchanges unprocessed wafers W with processed wafers W in the processing chamber 62. Two wafers W are held by each hand 66a, 66b when the robot 66 transfers the wafers W between the preparatory chambers 64, 65 and the vacuum chamber 63 and between the vacuum chamber 63 and the processing chamber 62. Since two wafers W are held by each hand 66a, 66b, the transfer of the wafers W is more efficient in comparison to when only one wafer W is held by each hand 66a, 66b. Thus, the number of transferred wafers W per unit time is increased. Consequently, the length of time required for the producing apparatus 61 to transfer wafers W is shortened.

If the semiconductor producing apparatus 61 is used in a clean room, the wafers W exposed to atmospheric air must be transferred in clean environments. Thus, devices that are used to transfer wafers W in atmospheric air, such as the carriers 67, 68 and the preparatory chambers 64, 65, are installed at locations that are relatively cleaner than other locations. Devices that transfer wafers W in a vacuum state, such as the processing chamber 62 and the vacuum chamber 63, are installed at less clean locations.

In the prior art apparatus 61, the preparatory chambers 64, 65, which require a clean environment, are arranged next to each other. Therefore, the part of the apparatus 61 that is exposed to the atmosphere occupies a large amount of floor area, or horizontal area. The devices that transfer wafers W in the atmospheric air (located at the front section of the apparatus 61) occupy a large portion of the apparatus 61. Thus, the floor space requiring a cleaner environment is relatively large, which increases costs.

Accordingly, it is an objective of the present invention to provide an apparatus for producing semiconductor devices that occupies less floor area without decreasing throughput.

SUMMARY OF THE INVENTION

To achieve the above objective, the present invention provides an apparatus for handling wafer-like workpieces, wherein the apparatus comprises: a processing chamber to which a workpiece is transferred and for performing a predetermined process on the workpiece; and a first preparatory chamber and a second preparatory chamber for transferring the workpiece between the processing chamber and an exterior, wherein the first and second preparatory chambers are aligned vertically.

The present invention further provides an apparatus for handling semiconductors wafers, wherein the apparatus comprises: a processing chamber to which a wafer is transferred for performing a predetermined process on the wafer in a vacuum; a vacuum chamber, which is maintained at a controlled level of vacuum, laterally connected to the processing chamber; a transfer chamber, which is maintained at a controlled level of vacuum, laterally connected to the vacuum chamber, the transfer chamber having an upper side and a lower side; a first preparatory chamber connected to the upper side of the transfer chamber; a second preparatory chamber aligned vertically with the first preparatory chamber and connected to the lower side of the transfer chamber, wherein the first and second preparatory chambers are constructed to permit transfer of a wafer between the processing chamber and an exterior exposed to atmospheric pressure without exposing the transfer chamber to the atmospheric pressure.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A first embodiment according to the present invention will now be described with reference to FIGS. 2 to 8.

Figure 1:
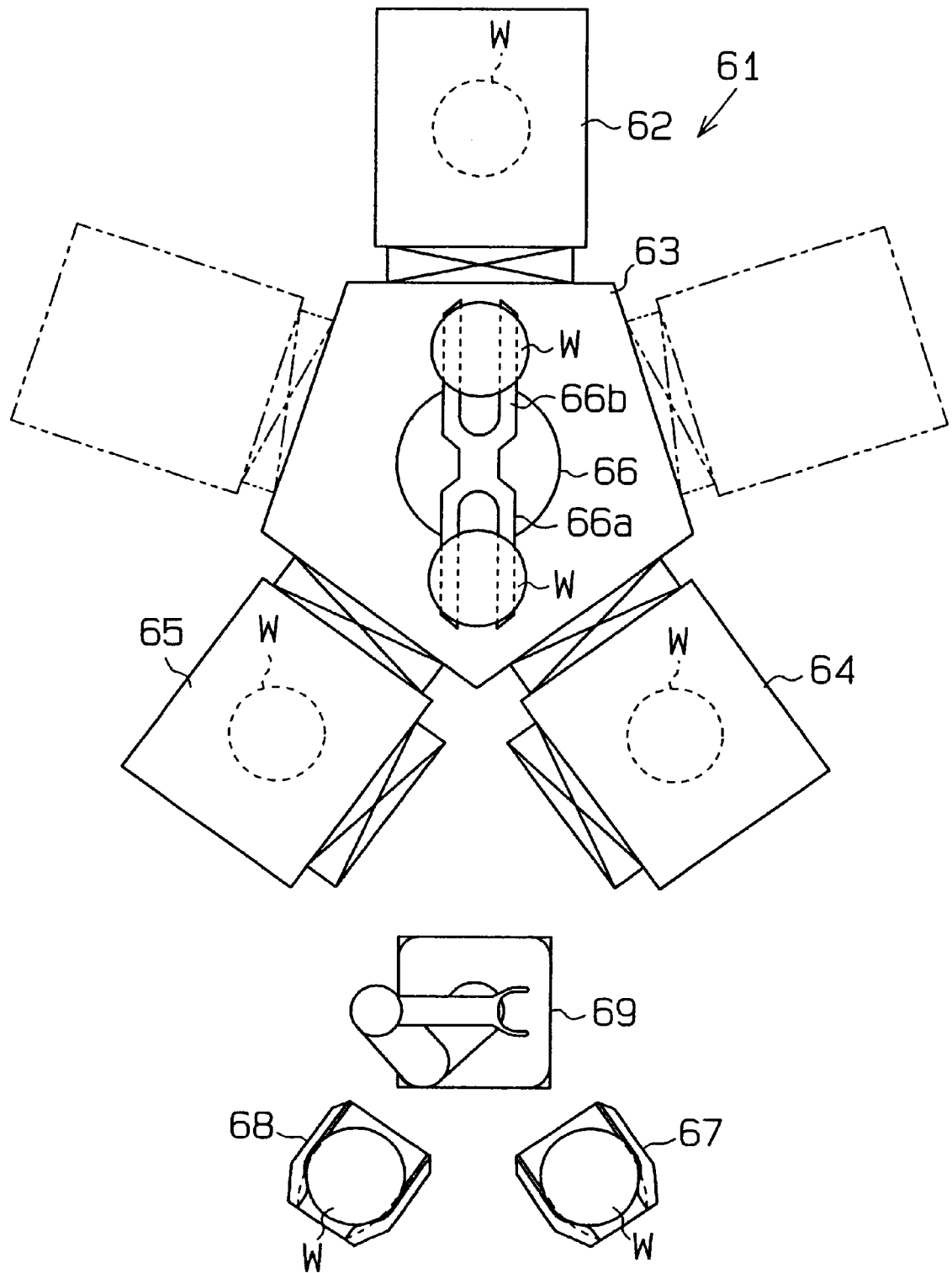
FIG. 1 is a schematic plan view showing a prior art semiconductor producing apparatus.
Figure 2:
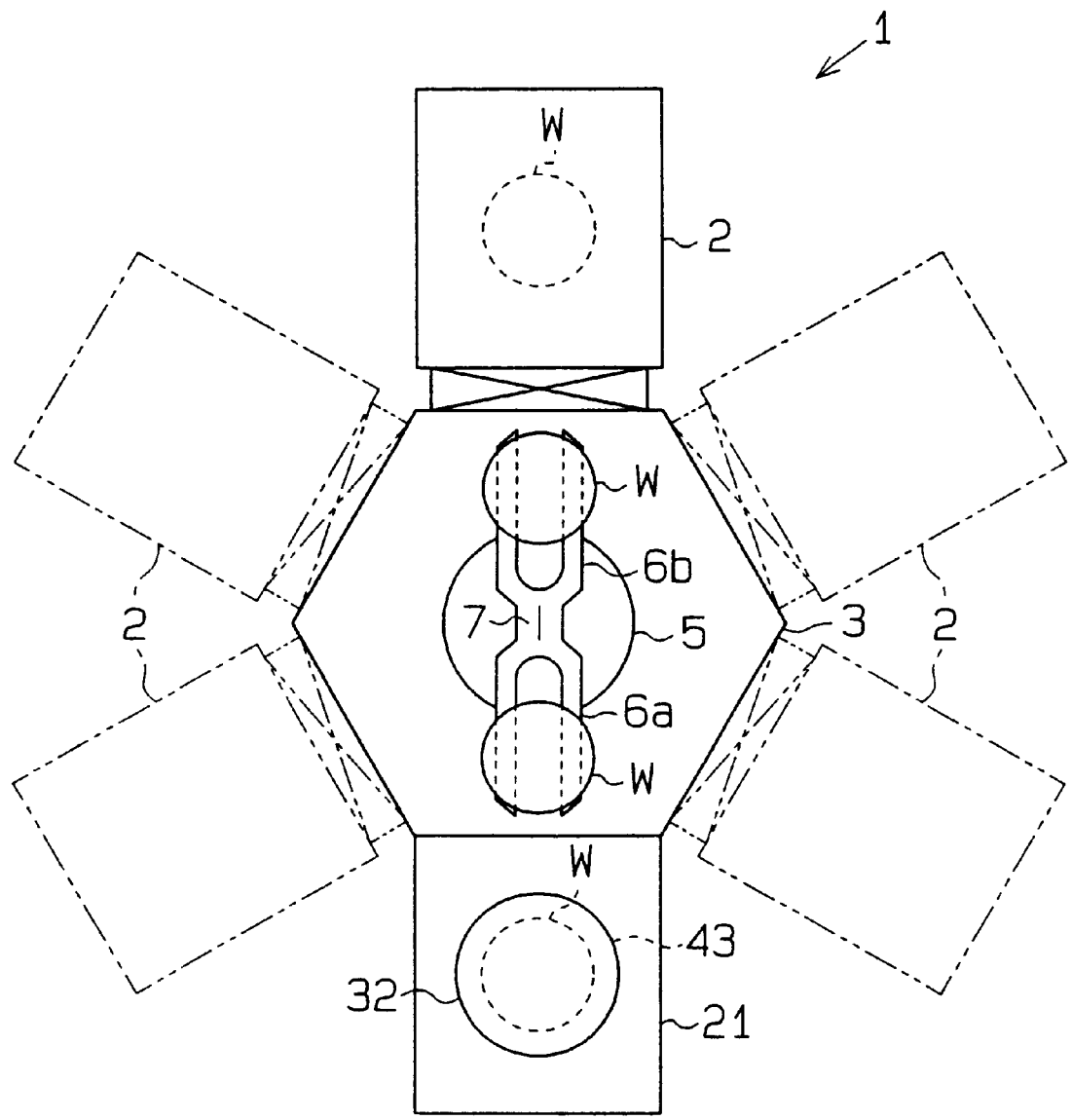
FIG. 2 is a schematic plan view showing a preferred embodiment of a semiconductor producing apparatus according to the present invention.
Figure 2:
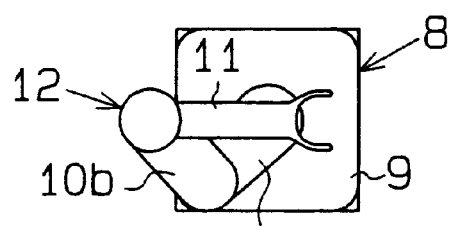
Figure 2:
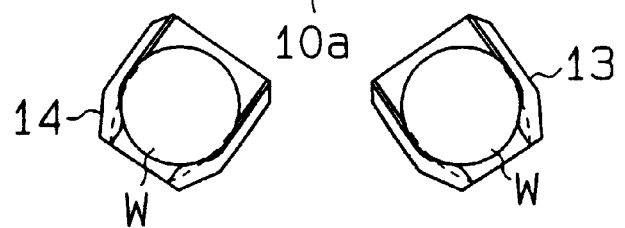

As shown in FIG. 2, a semiconductor producing apparatus 1 is provided with a processing chamber 2, a vacuum (handling) chamber 3, and a transfer chamber 21. An outside air of the apparatus 1 is preferably atmospheric enviroment, however, the outside air may be another atmosphere. The processing chamber 2, the vacuum chamber 3 and the transfer chamber 21 are prefarably maintained in a vacuum, or another atmosphere that is different from the atmospheric environment. A preparatory chamber 32 is arranged above the transfer chamber 21, while another preparatory chamber 43 is arranged below the transfer chamber 21. Each preparatory chamber 32, 43 communicates with the transfer chamber 21. Wafers W are transferred to the processing chamber 2 for processing. The preparatory chambers 32, 43 are used to transfer wafers W without exposing the processing chamber 2 to the atmosphere.

The vacuum chamber 3 is hexagonal and connected to the processing chamber 2 on one side and to the transfer chamber 21 on the opposite side. As shown by the dotted lines in FIG. 2, further processing chambers 2 may be connected to each of the remaining four sides of the vacuum chamber 3. Thus, a maximum number of five processing chambers 2 may be employed. In such case, five wafers may be processed simultaneously.

A first conveyor, or first robot 5, is installed in the vacuum chamber 3. The first robot 5 transfers wafers W in a vacuum environment between the processing chamber 2 and the transfer chamber 21. The robot 5 has an arm 7, and two hands 6a, 6b, which are located on opposite ends of the arm 7, respectively. Each hand 6a, 6b is rotatable in a horizontal plane about a vertical axis of the robot 5 and is radially movable with respect to the vertical axis of the arm 7.

The robot 5 transfers wafers W between the processing chamber 2 and the transfer chamber 21. More specifically, the robot 5 transfers processed and unprocessed wafers W by lifting a processed wafer W in the processing chamber 2 with one of the hands 6a (6b) and exchanging the processed wafer W with an unprocessed wafer W, which is held in the other hand 6b (6a). This structure enables a processed wafer W and an unprocessed wafer W to be transferred during a single step and thus shortens the actual time required to transfer a single wafer W.

A second conveyor, or an articulated-arm type second robot 8, is arranged in front of the transfer chamber 21 (toward the bottom of the drawing). The robot 8 has a base 9 and an arm 12. The arm 12, which is mounted on the base 9, includes a first arm portion 10a, a second arm portion 10b, and a hand 11. The second arm portion 10b is coupled to the distal end of the first arm portion 10a, while the hand 11 is connected to the distal end of the second arm portion 10b. The first arm portion 10a is rotatable in horizontal plane and is vertically movable along its rotating axis. The second arm portion 10b and the hand 11 are rotatable in a horizontal plane about a pivot joint between the arm portions 10a, 10b. Thus, the hand 11 is moved horizontally and vertically in accordance with the movement of the arm portions 10a, 10b.

Carriers 13, 14 are installed in front of the robot 8 at predetermined positions. Each carrier 13, 14 holds predetermined lots of processed and unprocessed wafers W. In each carrier 13, 14, the wafers W are stored in a level position. The unprocessed wafers W in the carriers 13, 14 are transferred to the transfer chamber 21 by the arm 12. The processed wafers W, which have been sent to the preparatory chambers 32, 43, are transferred to the carriers 13, 14 by the arm 12.

Figure 3:
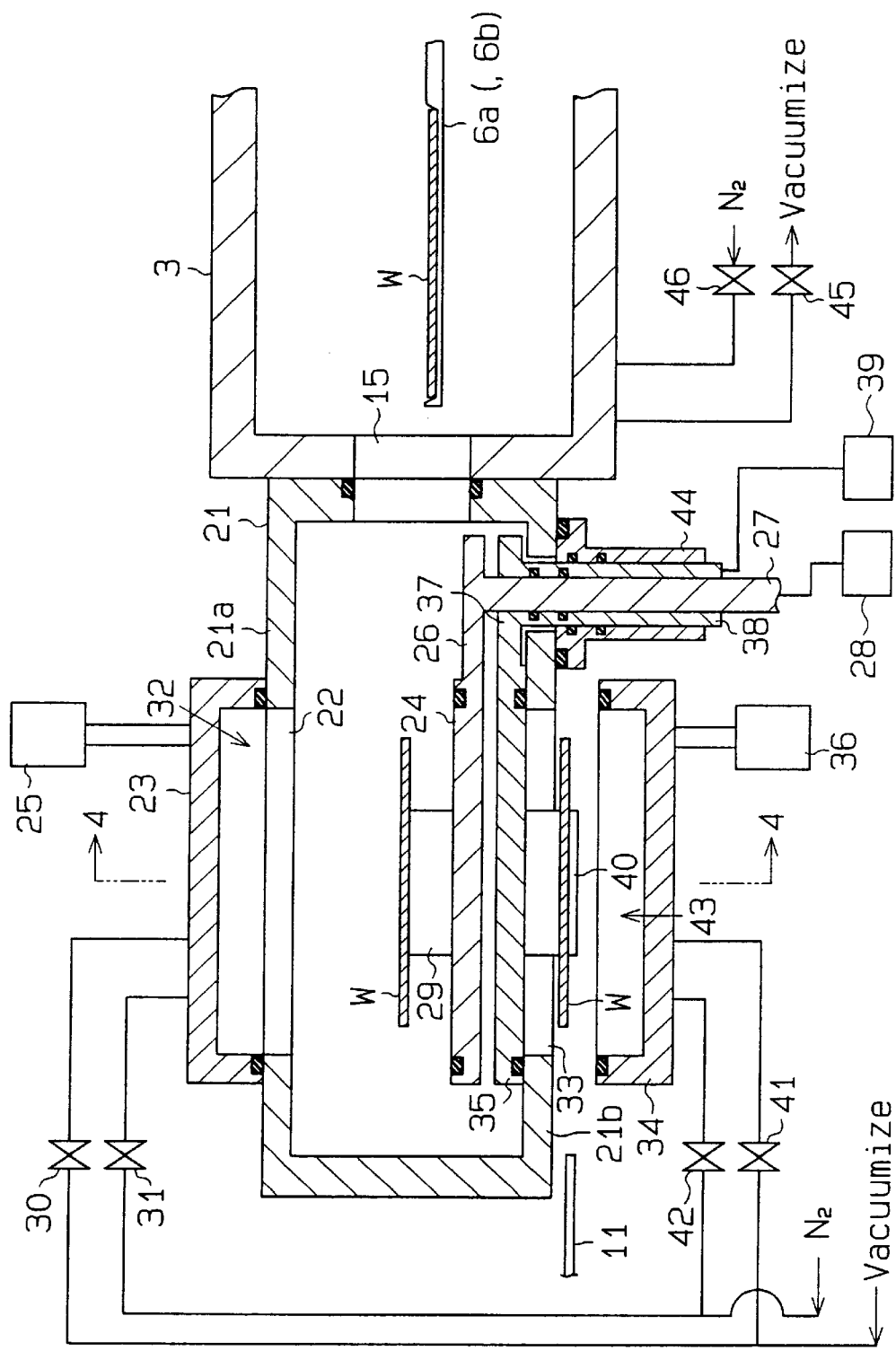
FIG. 3 is a diagrammatic cross-sectional view showing a preparatory chamber of the apparatus of FIG. 2.

As shown in FIG. 3, the box-like transfer chamber 21 is connected to the vacuum chamber 3 by a communication passage 15. Level wafers W are moved horizontally through the communication passage 15 between the vacuum chamber 3 and the transfer chamber 21, which are maintained in a vacuum.

The transfer chamber 21 has a top wall 21a through which a transfer passage 22 is formed. The transfer passage 22 is round and has a diameter that is larger than the wafers W to permit the transfer of the wafers W between the transfer chamber 21 and the carriers 13, 14.

An upper cover 23 is arranged on the top wall 21a of the transfer chamber 21 to selectively open and close the transfer passage 22. The upper cover 23 is cup-like and has a diameter that is substantially the same as that of the transfer passage 22. The upper cover 23 is supported by guides (not shown) so that it is vertically movable. An upper solenoid 25 drives the upper cover 23. The device for driving the upper cover 23 is not limited to the solenoid 25 and may be replaced by other devices such as a fluid cylinder or an electric motor. The upper solenoid 25 selectively moves the upper cover 23 between a closed position, at which the cover 23 closes the transfer passage 22, and a transfer position (refer to FIG. 6), at which the cover 23 opens the transfer passage 22.

An upper stage 24 is accommodated in the transfer chamber 21. The upper stage 24 is disk-like and has a diameter that is larger than that of the transfer passage 22. A support 26 extends laterally from the upper stage 24. The support 26 is connected to the top end of a cylindrical first shaft 27, which extends through the wall of the transfer chamber 21. The shaft 27 is connected to an upper fluid cylinder 28, which lowers or lifts the upper stage 24. The shaft 27 is arranged at a position that does not interfere with the transferring of the wafers W. The device for driving the shaft 27 is not limited to the fluid cylinder 28 and may be replaced by other devices such as a solenoid or an electric motor. The upper stage 24 illustrated in FIG. 3 is located at a lowermost position, which corresponds to a transfer position. When the upper stage 24 is lifted, the upper surface of the upper stage 24 comes into contact with the lower surface of the top wall 21a and closes the transfer passage 22 (refer to FIG. 6). In this state, the upper stage 24 is located at a closed position.

Figure 4:
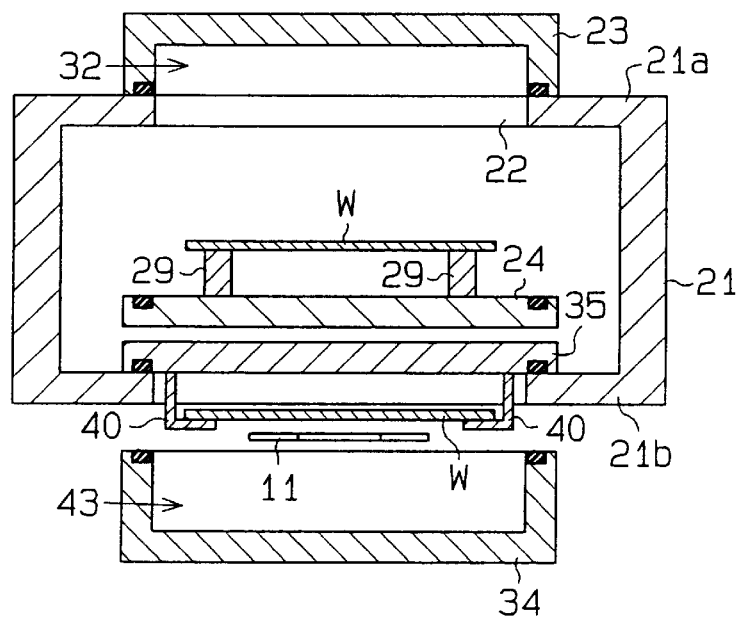
FIG. 4 is a diagrammatic cross-sectional view taken along line 4—4 in FIG. 3.

A pair of upper wafer holders 29 are arranged on the upper surface of the upper stage 24. As shown in FIG. 4, the upper holders 29 hold each wafer W at a predetermined height from the surface of the upper stage 24.

Figure 6:
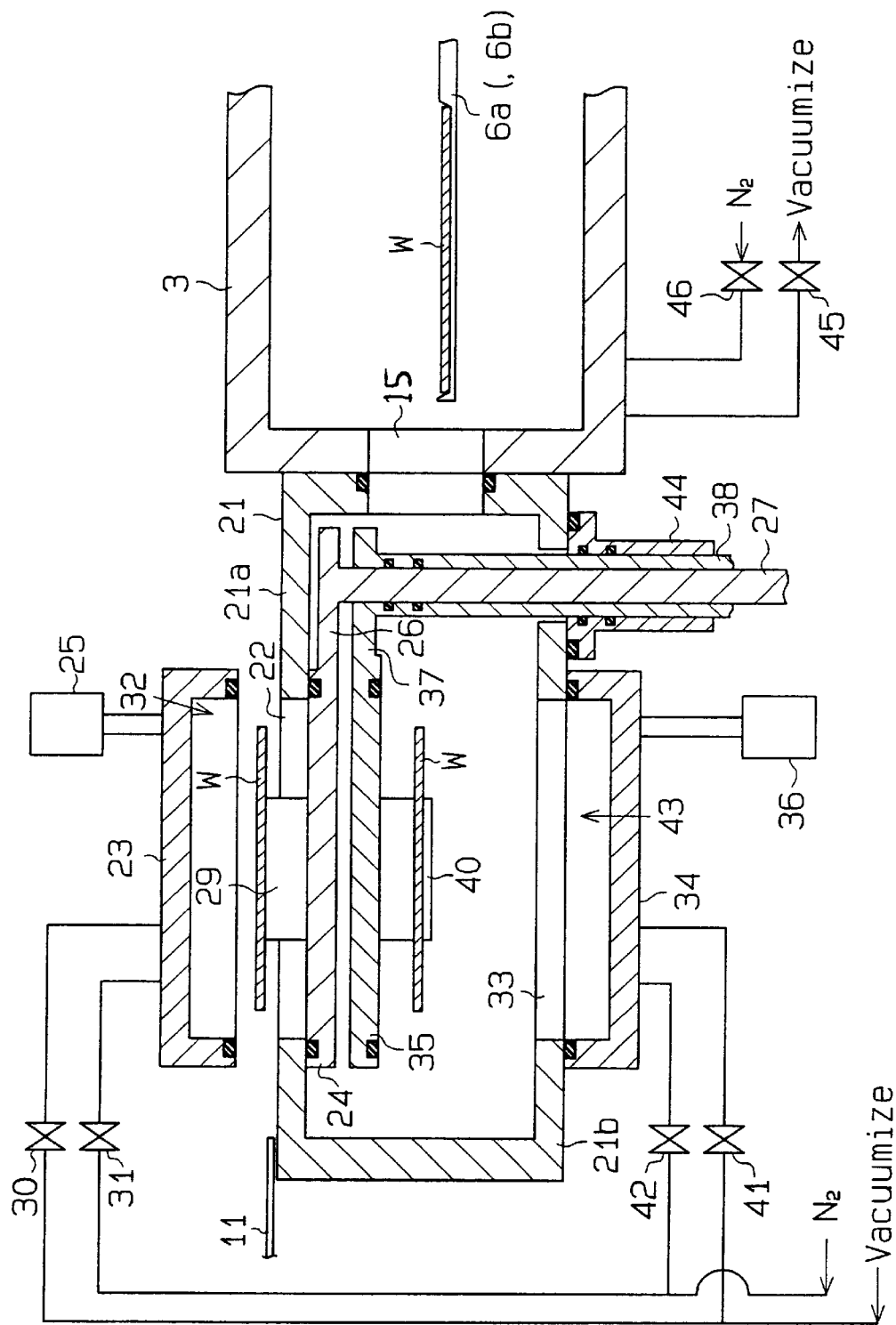
FIG. 6 is a diagrammatic cross-sectional view showing the preparatory chamber during the transfer of wafers W.
Figure 7:
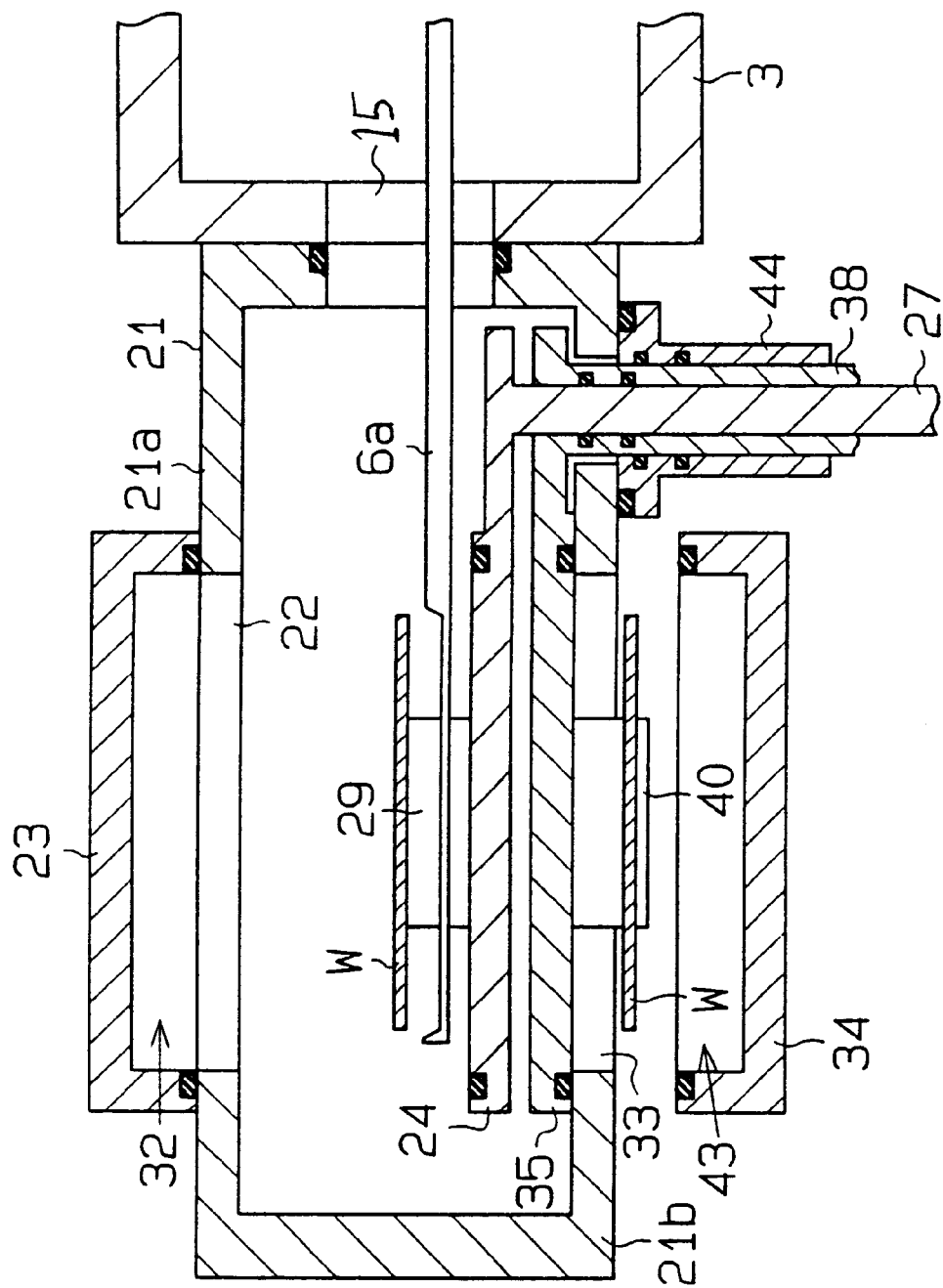
FIG. 7 is a diagrammatic cross-sectional view showing the preparatory chamber during the transfer of wafers W.

As shown in FIG. 6, when the upper stage 24 is located at the closed position, the wafer W held on the upper holders 29 is arranged above the top wall 21a. The hand 11 of the second robot 8 lifts the wafer W at this position. When the upper stage 24 is lowered to the transfer position shown in FIG. 3, the wafer W is held on the upper holders 29 at a position enabling the hand 6a (or hand 6b) of the first robot 5 to lift the wafer W.

An upper vacuum valve 30 and an upper atmospheric valve 31 are connected to the upper cover 23. The upper preparatory chamber 32 is defined when the upper cover 23 and the upper stage 24 are both located at their closed positions. If the upper vacuum valve 30 is opened in this state, a vacuum pump (not shown) discharges gases out of the sealed upper preparatory chamber 32 until the chamber 32 reaches a predetermined level of vacuum.

When the upper stage 24 is lowered to the transfer position, one of the hands 6a (6b) of the first robot 5 lifts an unprocessed wafer W on the holders 29 to transfer the wafer W to the processing chamber 2. The processed wafer W held by the other hand 6b (6a) is then placed on the upper holders 29 and is lifted by the upper stage 24 to the upper preparatory chamber 32.

If the atmospheric valve 31 is opened with the upper preparatory chamber 32 in a sealed state, the chamber 32 is supplied with nitrogen gas by a supply source (not shown) until the pressure in the chamber 32 becomes equal to the atmospheric pressure. When the upper cover 23 is moved to the transfer position, the hand 11 of the first robot 5 lifts a processed wafer W on the holders 29 to transfer the wafer W to the carriers 13, 14, which are located in atmospheric environments. The hand 11 then transfers an unprocessed wafer W stored in the carriers 13, 14 to the upper holders 29, which are still located at the same position. In this state, the bottom of the transfer passage 22 is closed by the upper stage 24. Thus, the transfer chamber 21, the vacuum chamber 3, and the processing chamber 2 are maintained in a vacuum state. Accordingly, the wafers W are transferred between the carriers 13, 14 and the vacuum chamber 3 while the transfer chamber 21 is maintained in a vacuum.

As shown in FIG. 3, the upper and lower sections of the transfer chamber 21 are mostly symmetrical and identical to each other. Thus, parts that are identical will not be described. Parts differing from the upper section will now be described.

A support 37 extends laterally from a lower stage 35. The support 37 is connected to the top end of a tubular second shaft 38. The first shaft 27 extends through the second shaft 38. The first and second shafts 27, 38 are coaxial. The second shaft 38 and the support 37 are arranged at a position that does not interfere with the transferring of the wafers W. However, the arrangement of the second shaft 38 and the first shaft 27 are not limited to the illustrated construction and may be arranged at numerous other positions that do not interfere with the movement of the wafers W. Furthermore, the first and second shafts 27, 38 do not necessarily have to be coaxial to each other. The second shaft 38 is inserted into a sleeve 44. Although the first and second shafts 27, 38 are vertically movable, the space between the shafts 27, 38 and the space between the shaft 38 and the sleeve 44 are sealed. Thus, the transfer chamber 21 is maintained in a sealed state.

As shown in FIG. 4, the lower stage 35 has a pair of L-shaped holders 40 to hold a wafer W. The lower holders 40 hold the wafer W at a position that is separated from the lower surface of the lower stage 35 by a predetermined distance.

As shown in FIG. 3, when the lower stage 35 is located at the closed position, the lower holders 40 are arranged below the lower surface of a bottom wall 21b of the transfer chamber 21. The hand 11 of the second robot 8 lifts the wafer W at this position. When the lower stage 35 is lifted to the transfer position shown in FIG. 6, the wafer W is held on the lower holders 29 at a position enabling the hand 6a (or hand 6b) of the first robot 5 to lift the wafer W.

A vacuum valve 45 and an atmospheric valve 46 are connected to the vacuum chamber 3. If the vacuum valve 45 is opened, the gases in the vacuum chamber 3 are discharged until the chamber 3 reaches a certain level of vacuum. If the atmospheric valve 46 is opened, the pressure in the vacuum chamber 3 becomes equal to the atmospheric pressure. The vacuum level of the vacuum chamber 3 decreases when the wafers W are transferred between the vacuum chamber 3 and the carriers 13, 14. Thus, the vacuum valve 45 is provided to maintain the vacuum pressure in the vacuum chamber 3 equal to that in the processing chamber 2.

When the preparatory chambers 32, 43 are depressurized to the same vacuum pressure as the processing chamber 2, a long period of time is necessary to discharge the gases. This lengthens the period of time required to transfer the wafers W. Thus, each wafer W is transferred into the vacuum chamber 3 as soon as the pressure in the preparatory chambers 32, 43 falls to a predetermined value. Each unprocessed wafer W is then transferred into the processing chamber 2 when the pressure in the vacuum chamber 3 becomes equal to the vacuum pressure in the processing chamber 2. This decreases the time required for discharging gases from the preparatory chambers 32, 43 and shortens the wafer transfer time.

Figure 5:
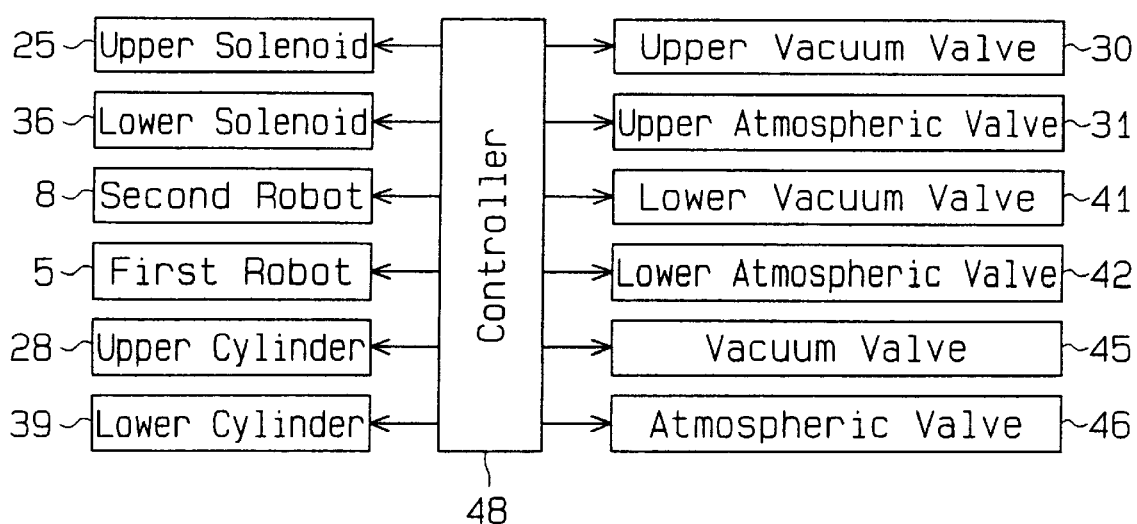
FIG. 5 is a block diagram showing the electric structure of a controller.

FIG. 5 illustrates the electric structure of a controller 48, which is employed to control various actuators. The solenoids 25, 36 are connected to the controller 48. The controller 48 actuates the solenoids 25, 36 to shift the associated covers 23, 34 between the transfer position and the closed position.

The cylinders 28, 39 are also connected to the controller 48. The controller 48 actuates the cylinders 28, 39 to shift the associated stages 24, 35 between the closed position and the transfer position. The first and second robots 5, 8 are also connected to the controller 48. The controller 48 controls the first robot 5 to transfer wafers W between the transfer chamber 21 and the processing chamber 2. The controller 48 controls the second robot 8 to transfer wafers W between the carriers 13, 14 and the preparatory chambers 32, 43.

The valves 30, 31, 41, 42, 45, 46 are connected to the controller 48. The controller 48 selectively opens and closes each valve 30, 31, 41, 42, 45, 46 to adjust the vacuum pressure in the associated chambers 3, 21, 32, 42.

The transferring of the wafers W by the semiconductor producing apparatus will now be described.

When the upper preparatory chamber 32 is closed and sealed with a processed wafer W accommodated therein, the lower cover 34 is arranged at its closed position and the lower stage 35 is arranged at its transfer position.

In this state, the controller 48 opens the atmospheric valve 31 until the pressure in the upper preparatory chamber 32 becomes equal to the atmospheric pressure. As shown in FIG. 6, the controller 48 then actuates the upper solenoid 25 to move the upper cover 23 to the transfer position. The controller 48 controls the second robot 8 to lift a processed wafer W held on the upper holders 29 with the hand 11 and transfer the wafer W to the carriers 13, 14.

The controller 48 then controls the second robot 8 to lift an unprocessed wafer W, stored in the carriers 13, 14, and transfer the wafer W onto the upper holders 29. Afterward, the controller 48 actuates the upper solenoid 25 to move the upper cover 23 to its closed position. This closes and seals the preparatory chamber 32. The upper vacuum valve 30 is then opened to discharge gases from the preparatory chamber 32 and depressurize the preparatory chamber 32 to a vacuum pressure.

In the meantime, the controller 48 controls the first robot 5 to lift the processed wafer W in the processing chamber 2 with one of the hands 6a (6b) of the first robot 5. An unprocessed wafer W held by the other hand 6b (6a) is transferred into the processing chamber 2 for subsequent processing.

The controller 48 subsequently actuates the upper cylinder 28 and lowers the upper stage 24 to the transfer position. The controller 48 then controls the first robot 5 to lift the unprocessed wafer W held on the upper holders 29 with one of the hands 6a (6b) and transfer the processed wafer W held by the other hand 6b (6a) onto the upper holders 29.

The transfer of the wafers W between the processing chamber 2 and the carriers 13, 14 by way of the upper preparatory chamber 32 is performed as described above. The transferring of the wafers W between the processing chamber 2 and the carriers 13, 14 by way of the lower preparatory chamber 43 is performed in the same manner.

The advantages obtained by the preferred and illustrated embodiments will now be described.

The two preparatory chambers 32, 43 of the semiconductor producing apparatus 1 are located vertically above and below the transfer chamber 21. Thus, the area occupied by the preparatory chambers 32, 43 is decreased dramatically in comparison to the prior art preparatory chambers 64, 65, which are arranged horizontally.

Figure 8:
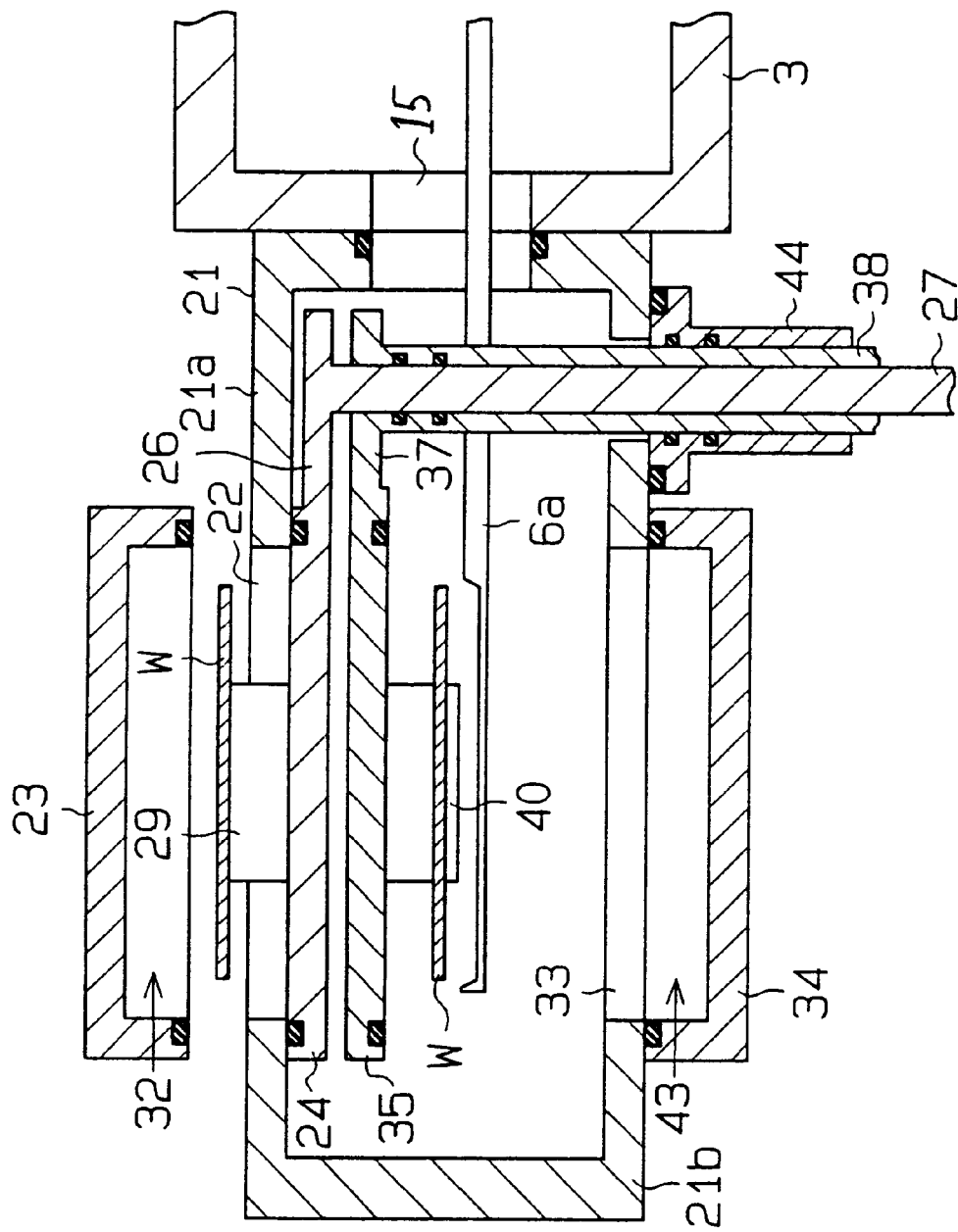
FIG. 8 is a diagrammatic cross-sectional side view showing the preparatory chamber during the transfer of wafers W.

The transfer position of the upper holders 29 (refer to FIG. 7) is the same as the transfer position of the lower holders 40 (refer to FIG. 8). Thus, the transfer of wafers W between the holders 29, 40 and the hands 6a, 6b is performed in the same manner regardless of which holder 29, 40 is holding the wafer W. This simplifies the movement of the robot 5. Thus, the robot 5 transfers wafers W at a faster speed in comparison to when different movements are necessary for different holders 29, 40.

In the prior art semiconductor producing apparatus 61, the preparatory chambers 64, 65 are arranged along the same horizontal plane. Thus, the transfer route for transferring wafers W to the preparatory chambers 64, 65 must be set separately for each chamber 64, 65. However, in the semiconductor producing apparatus 1 according to the present invention, the transfer route of each hand 6a, 6b for the corresponding holders 29, 40 is the same. This reduces the number of robot teaching points.

It should be apparent to those skilled in the art that the present invention may be embodied in many other specific forms without departing from the spirit or scope of the invention. Particularly, it should be understood that the invention may be embodied in the following forms.

Figure 9:
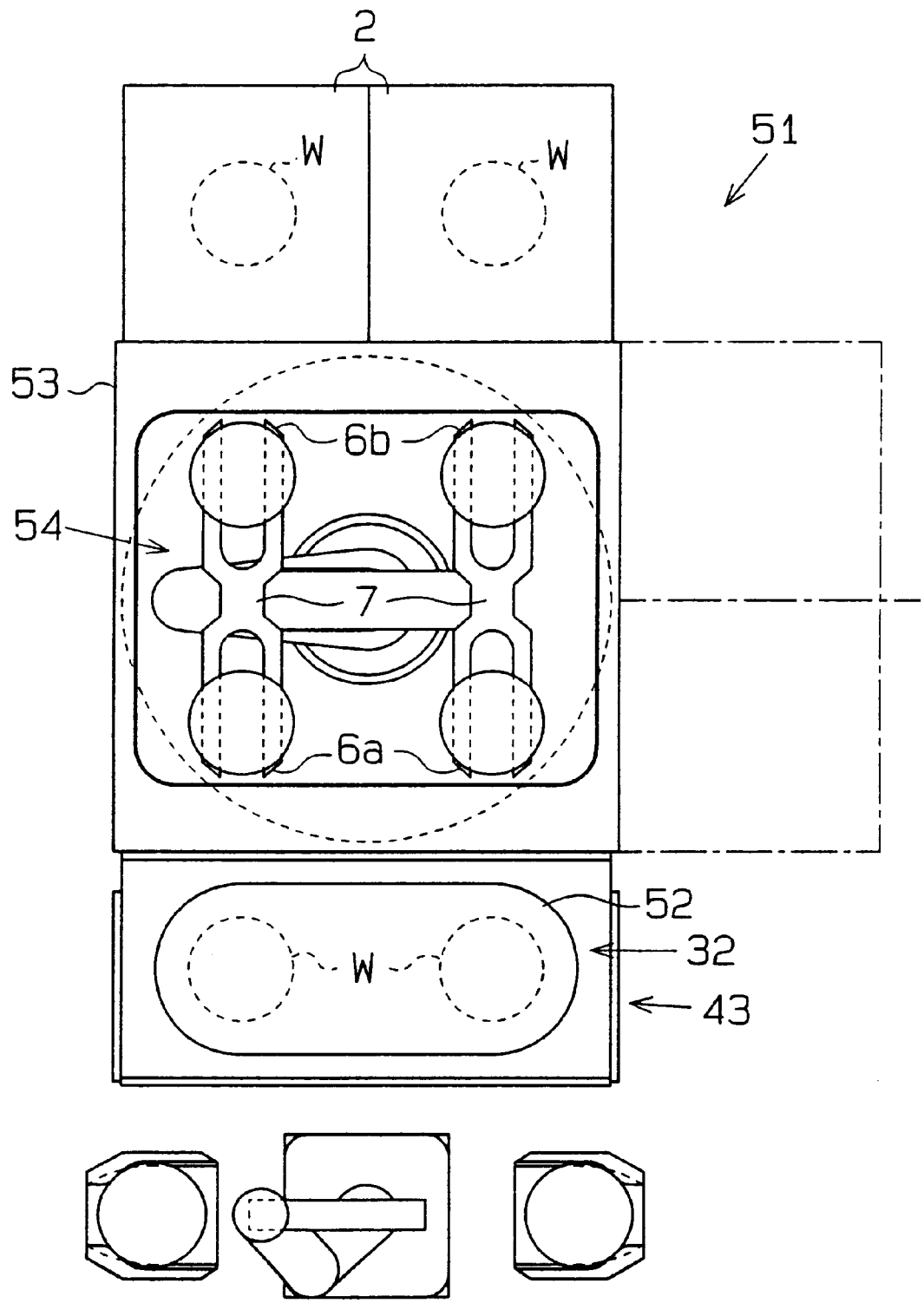
FIG. 9 is a schematic plan view showing a further embodiment of a semiconductor producing apparatus according to the present invention.

More than one wafer W may be accommodated in each preparatory chamber 32, 43. For example, as shown in FIG. 9, a semiconductor producing apparatus 51 having two preparatory chambers 32, 43 (the lower preparatory chamber 43 is not shown) may accommodate two wafers W in each preparatory chamber 32, 43. In this case, the upper cover 52 and the upper stage (not shown) are elliptical. A robot 54, which is installed in a vacuum chamber 53, has two arms 7 with each arm 7 having two hands 6a, 6b to simultaneously transfer two wafers W. The apparatus 51 includes two processing chambers 2 to simultaneously process two wafers W. This structure increases the throughput.

In the embodiment of FIGS. 2 to 8, the shape of the covers 23, 34 may be changed arbitrarily as long as the covers 23, 34 are capable of sealing the associated preparatory chambers 32, 43. For example, the covers 23, 34 may be box-like. Furthermore, as long as wafers W may be transferred between the preparatory chambers 32, 43 and the carriers 13, 14, the covers 23, 34 need not be moved as one piece but may be moved in segments.

The present invention is embodied in a semiconductor producing apparatus that processes semiconductor wafers (semiconductor substrates). However, the present invention may also be embodied in an apparatus that transfers and processes other types of workpieces such as glass substrates used for sapphire substrate liquid crystal displays (LCD) and plasma displays (PDP). In such cases, the same advantages of the preferred embodiments are obtained.

Therefore, the present examples and embodiments are to be considered as illustrative and not restrictive and the invention is not to be limited to the details given herein, but may be modified within the scope and equivalence of the appended claims.

What is claimed is:

1. An apparatus for handling wafer-like workpieces, wherein the apparatus comprises:
   a processing chamber to which a workpiece is transferred and for performing a predetermined process on the workpiece;
   a first preparatory chamber and a second preparatory chamber for transferring the workpiece between the processing chamber and an exterior, wherein the first and second preparatory chambers are aligned vertically;
   a handling chamber connected to the processing chamber;
   a transfer chamber connected to the handling chamber, said transfer chamber having an upper side and a lower side, the first preparatory chamber being connected to the upper side of the transfer chamber and the second preparatory chamber being connected to the lower side of the transfer chamber;
   transfer means disposed in the handling chamber for transferring the workpieces between the processing chamber and the transfer chamber;
   an upper stage located in the transfer chamber to hold and transfer the workpieces between the first preparatory chamber and the transfer chamber;
   a lower stage located in the transfer chamber to hold and transfer the workpiece between the second preparatory chamber and the transfer chamber; and
   a substantially horizontally arranged movable upper cover for selectively communicating and disconnecting the exterior with the first preparatory chamber and a substantially horizontally arranged movable lower cover for selectively communicating and disconnecting the exterior with the second preparatory chamber.

2. The apparatus according to claim 1, wherein a predetermined process is performed on the workpiece in a vacuum, the exterior is exposed to atmospheric pressure, and the workpiece is transferred between the processing chamber and each preparatory chamber without exposing the processing chamber to the atmospheric pressure.

3. The apparatus according to claim 1, wherein the processing chamber is maintained in an atmosphere that is different from an atmosphere of the exterior when the workpiece is processed.

4. The apparatus according to claim 1, wherein the upper stage is selectively moved between a closed position, at which the upper stage disconnects the first preparatory chamber from the transfer chamber, and a transfer position, at which the upper stage permits the first preparatory chamber to communicate with the transfer chamber to allow the transfer of the workpieces between the handling chamber and the transfer chamber, and wherein the lower stage is selectively moved between a closed position, at which the lower stage disconnects the second preparatory chamber from the transfer chamber, and a transfer position, at which the lower stage permits the second preparatory chamber to communicate with the transfer chamber to allow the transfer of the workpieces between the handling chamber and the transfer chamber.

5. The apparatus according to claim 4, wherein each stage has a holder to hold the workpieces at a location that is separated from the stage by a predetermined distance.

6. The apparatus according to claim 5, wherein the location of a workpiece held by the upper stage when the upper stage is located at the transfer position is the same as the location of a workpiece held by the lower stage when the lower stage is located at the transfer position.

7. The apparatus according to claim 4, wherein the upper stage is located at the closed position when the lower stage is located at the transfer position, and the upper stage is located at the transfer position when the lower stage is located at the closed position.

8. The apparatus according to claim 1, wherein the upper cover selectively moves between a closed position, at which the upper cover disconnects the first preparatory chamber from the exterior, and a transfer position, at which the upper cover permits the first preparatory chamber to communicate with the exterior to allow the transfer of the workpieces between the first preparatory chamber and the exterior, and wherein the lower cover selectively moves between a closed position, at which the lower cover disconnects the second preparatory chamber from the exterior, and a transfer position, at which the lower cover permits the second preparatory chamber to communicate with the exterior and allows the transfer of the workpieces between the second preparatory chamber and the exterior.

9. The apparatus according to claim 8, wherein the pressure in each preparatory chamber is controlled to change between a pressure in the processing chamber and a pressure in the exterior when sealed by the associated stage and cover.

10. The apparatus according to claim 1, wherein the apparatus further comprises a second conveyor for transferring the workpieces between the exterior and each preparatory chamber.

11. The apparatus according to claim 1, wherein the upper stage is supported by a first shaft and the lower stage is supported by a second shaft, the first shaft being coaxial with the second shaft.

12. The apparatus according to claim 11, wherein the second shaft is tubular and accommodates the first shaft so that the first shaft is vertically movable.

13. The apparatus according to claim 1, wherein the workpieces are semiconductor wafers.

14. An apparatus for handling semiconductor wafers, wherein the apparatus comprises:
a processing chamber to which a wafer is transferred and for performing a predetermined process on the wafer in a vacuum;
a vacuum chamber, which is maintained at a controlled level of vacuum, laterally connected to the processing chamber;
a transfer chamber, which is maintained at a controlled level of vacuum, laterally connected to the vacuum chamber, the transfer chamber having an upper side and a lower side;
a transfer member disposed in the handling chamber for transferring the workpieces between the processing chamber and the transfer chamber;
a first preparatory chamber connected to the upper side of the transfer chamber;
a second preparatory chamber aligned vertically with the first preparatory chamber and connected to the lower side of the transfer chamber, wherein the first and second preparatory chambers are constructed to permit transfer of a wafer between the processing chamber and an exterior exposed to atmospheric pressure without exposing the interior of the transfer chamber to the atmospheric pressure; and
a substantially horizontally arranged movable upper cover for selectively communicating and disconnecting the exterior with the first preparatory chamber and a substantially horizontally arranged movable lower cover for selectively communicating and disconnecting the exterior with the second preparatory chamber.

15. The apparatus according to claim 14, wherein the apparatus further comprises:
a conveyor installed in the vacuum chamber to transfer a wafer horizontally between the processing chamber and the transfer chamber;
an upper stage located in the transfer chamber to hold and transfer a wafer vertically between the first preparatory chamber and the transfer chamber; and
a lower stage located in the transfer chamber to hold and transfer a wafer vertically between the second preparatory chamber and the transfer chamber.

16. The apparatus according to claim 15, wherein the upper stage is selectively moved between a closed position, at which the upper stage disconnects the first preparatory chamber from the transfer chamber, and a transfer position, at which the upper stage permits the first preparatory chamber to communicate with the transfer chamber to allow the transfer of the wafers between the vacuum chamber and the transfer chamber, and wherein the lower stage is selectively moved between a closed position, at which the lower stage disconnects the second preparatory chamber from the transfer chamber, and a transfer position, at which the lower stage permits the second preparatory chamber to communicate with the transfer chamber to allow the transfer of a wafer between the vacuum chamber and the transfer chamber.

17. The apparatus according to claim 16, wherein each stage has a holder to hold a wafer at a location that is separated from the stage by a predetermined distance.

18. The apparatus according to claim 17, wherein the location of a wafer held by the upper stage when the upper stage is located at the transfer position is the same as the location of a wafer held by the lower stage when the lower stage is located at the transfer position.

\* \* \* \* \*